United States Patent [19]

Menard et al.

[11] Patent Number: 4,939,426

[45] Date of Patent: Jul. 3, 1990

[54] LIGHT EMITTING DIODE ARRAY

[75] Inventors: Peter F. Menard, Windsor; Paul R. Allen, North Adam, both of Mass.

[73] Assignee: United States of America, Washington, D.C.

[21] Appl. No.: 449,319

[22] Filed: Dec. 11, 1979

Related U.S. Application Data

[63] Continuation of Ser. No. 27,910, Mar. 19, 1987, abandoned.

[51] Int. Cl.[5] ........................ H05B 43/00; H03K 3/42

[52] U.S. Cl. ........................ 315/192; 315/51; 315/185 R; 315/200 R; 315/312; 362/800

[58] Field of Search .................... 362/800; 315/53, 51, 315/135, 158, 185 R, 312, 205, 192; 340/782

[56] References Cited

U.S. PATENT DOCUMENTS 3,795,830 3/1974 Richardson ..................... 362/800 X
3,869,641 3/1975 Goldberg ........................... 315/135
4,211,955 7/1980 Ray ................................ 315/182 R
4,298,869 11/1981 Okund ................................ 340/782
4,329,625 5/1982 Nishizawa et al. ................... 315/53

*Primary Examiner*—James J. Groody
*Assistant Examiner*—Mark R. Powell
*Attorney, Agent, or Firm*—Robert M. Wohlfarth; John P. Tarlano

[57] ABSTRACT

A light emitting diode lamp that operates directly from an AC input. The lamp has an even number of light emitting diodes that are disposed on a cylindrical cluster plate. The diodes are separated into two halves that are conductable in opposite electrical directions. The two halves of diodes are connected at two terminals. The diodes are arranged in a circular configuration near the edge of the circular cluster plate. Leads are connected to the terminals. The leads extend toward the center of the circular configuration and extend through the cluster plate. A modifying resistor is connected between one lead and an end terminal of a lamp housing. The other lead is connected to a base terminal of the lamp housing.

3 Claims, 4 Drawing Sheets

LIGHT EMITTING DIODE ARRAY

This is a continuation of application Ser. No. 27,910, filed Mar. 19, 1987, now abandoned.

BACKGROUND OF THE INVENTION

1. Field Of The Invention

The present invention relates generally to a light emitting diode array and more particularly to a light emitting diode lamp containing such an array and capable of indicating the presence of an AC input signal.

2. Description Of The Prior Art

The prior art shows back-to-back light emitting diodes. They are energized by an AC input signal having a voltage equal to the operating voltage of the light emitting diodes. However, the diodes are not able to operate under the influence of an AC input signal of a higher voltage than their proper operating voltage.

In the disclosed invention, an array has back-to-back light emitting diodes and a modifying resistor. The light emitting diodes and modifying resistor are arranged to use an AC input signal having a higher voltage than the operating voltage of the light emitting diodes, themselves. Such an array is used in a lamp.

SUMMARY OF THE INVENTION

An even number of light emitting diodes are electrically connected, with each half of the number of diodes conductable in a different electrical direction. The diodes form a parallel circuit configuration. A modifying resistor is connected to a first point on the parallel circuit. The value of the modifying resistor is selected to reduce the voltage of an AC input signal in order to properly activate half the light emitting diodes at a time. A free end of the modifying resistor is connected to a first terminal of a lamp housing for the array. A second point on the parallel circuit is connected to a second terminal of the lamp housing.

DESCRIPTION OF THE PREFERRED EMBODIMENT

Figure 1A:
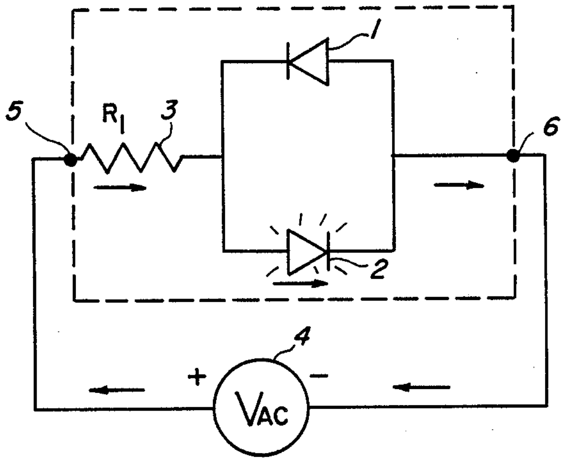
FIGS. 1A and 1B are schematic diagrams of a first embodiment of the array of the present invention.
Figure 1B:
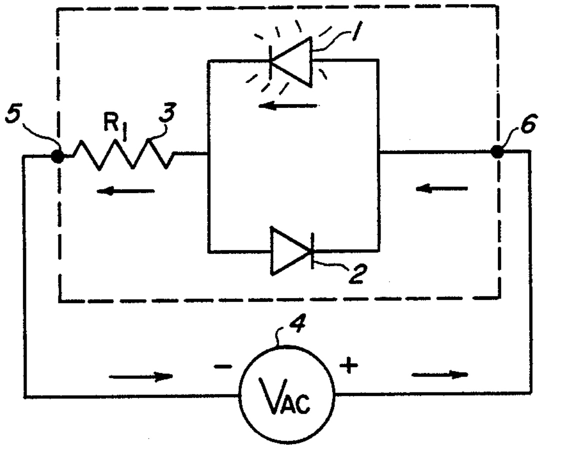

FIGS. 1A and 1B show, in the dashed boxes, a first embodiment of the light emitting diode array of the present invention. A light emitting diode 1 is placed in a back-to-back configuration with light emitting diode 2, in the array. A modifying resistor 3 is placed in the array, in series with the light emitting diode circuit made up of diodes 1 and 2.

The resistance value R1 of resistor 3 is chosen according to the formula:

$$R1 = \frac{\frac{(Ro)\,(Vac - Vo)}{Vac}}{1 - \frac{(Vac - Vo)}{Vac}}$$

wherein

Vac is the root means squared (RMS) voltage of an AC input signal from an AC power source, Ro is internal resistance of a light emitting diode, and Vo is the proper operating voltage for the light emitting diode 1 and 2.

The resistance value R1 of resistor 3 depends on the input voltage of an AC input signal, and the proper operating voltage and internal resistance of the light emitting diodes used. The value is chosen so that a single diode is properly activated.

In FIG. 1A, the power source 4 applies an AC input signal between terminals 5 and 6, such that there is a positive voltage on terminal 5 and a negative voltage on terminal 6. With power source 4 in this state, current flows through resistor 3 and then through light emitting diode 2. Current does not flow through light emitting diode 1. Light emitting diode 2 produces light.

In FIG. 1B, the power source 4 applies an AC input signal between terminals 5 and 6 such that there is a positive voltage on terminal 6 and a negative voltage on terminal 5. With the power source 4 in this state, current flows through light emitting diode 1, and then through resistor 3. Current does not flow through light emitting diode 2 at this time. Light emitting diode 1 produces light.

Figure 2A:
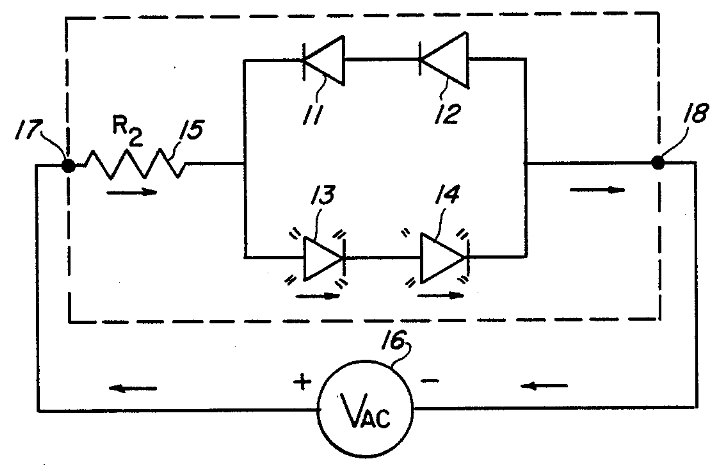
FIGS. 2A and 2B are schematic diagrams of a second embodiment of the array of the present invention.
Figure 2B:
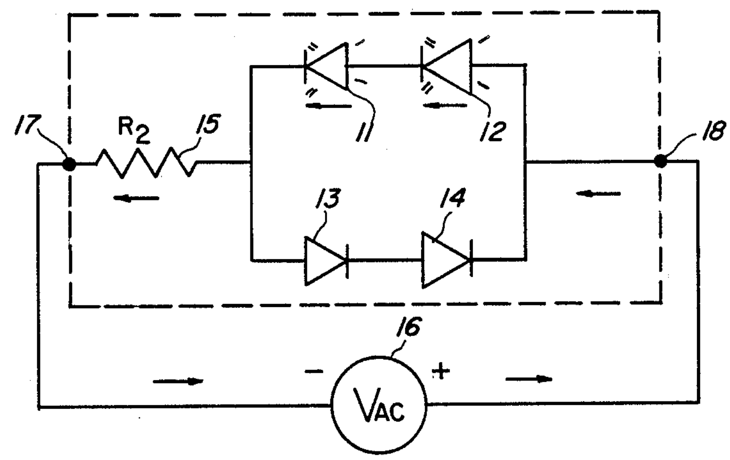

FIGS. 2A and 2B show, in the dashed boxes, a second embodiment of the light emitting diode array of the present invention. Light emitting diodes 11 and 12 are placed in the array so that they both conduct in the same electrical direction. Light emitting diodes 13 and 14 are placed in the circuit such that they both conduct in the same electrical direction but in an opposite electrical direction from diodes 11 and 12.

A modifying resistor 15 is placed in the array, in series with the light emitting diode subcircuit made up of diodes 11, 12, 13 and 14. The resistance value R2 of resistor 15 is chosen according to the following formula:

$$R2 = \frac{\frac{(2Ro)\,(Vac - 2Vo)}{Vac}}{1 - \frac{(Vac - 2Vo)}{Vac}}$$

It is noticed that this formula is different than the formula used to calculate the proper value of the modifying resistor for the array of FIGS. 1A and 1B. The resistance value is chosen so that diodes 11 and 12 or diodes 13 and 14 are properly activated.

The formula, used to calculate the proper resistance, is in general as follows:

$$Rn = \frac{\frac{(NRo)\,(Vac - NVo)}{Vac}}{1 - \frac{(Vac - NVo)}{Vac}}$$

wherein N is an integer and is the number of diodes in one half of the light emitting diode circuit. The total number of diodes in such a circuit is 2N diodes. Thus, it is seen that the array of the invention contemplates a light emitting diode circuit having an even number of diodes plus a modifying resistor whose value is chosen depending upon the number of diodes in a half of the light emitting diode circuit.

FIG. 2A shows that diodes 13 and 14 light when power supply 16 provides an AC input signal such that terminal 17 is positive and terminal 18 is negative. Diodes 11 and 12 do not light at this time.

FIG. 2B shows that diodes 11 and 12 light when power supply 16 provides an AC input signal such that terminal 17 is negative and terminal 18 is positive. Light emitting diodes 13 and 14 do not light at this time.

Figure 3A:
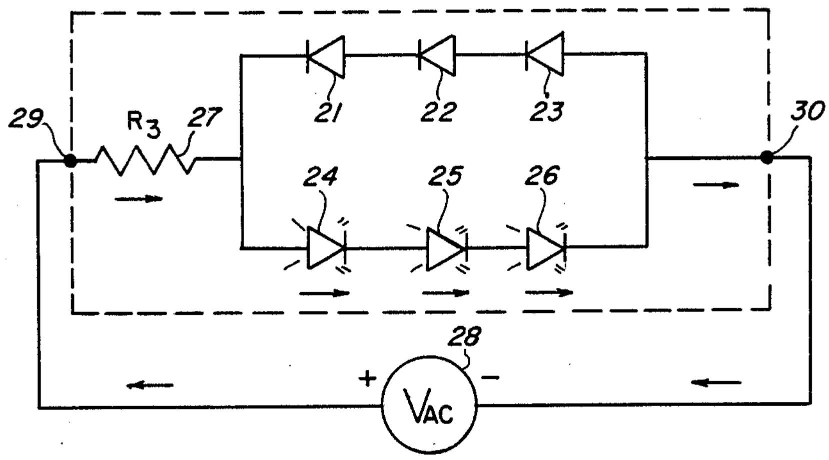
FIGS. 3A and 3B are schematic diagrams of a third embodiment of the array of the present invention.
Figure 3B:
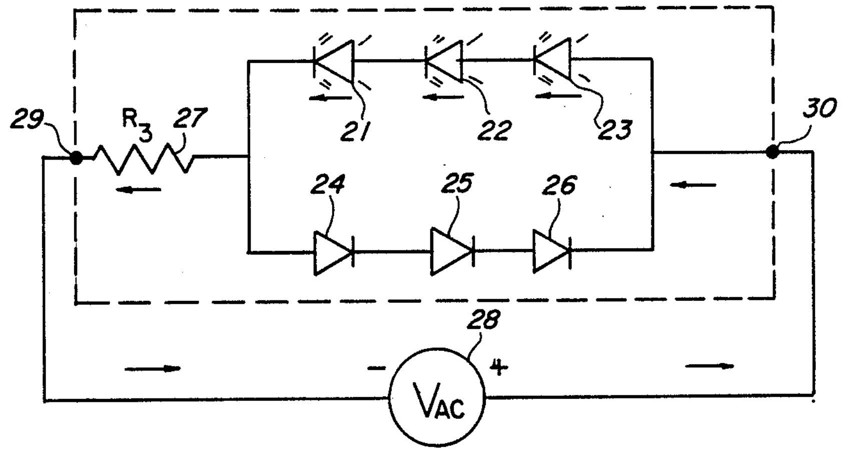

FIGS. 3A and 3B show, in the dashed boxes, a third embodiment of the light emitting diode array of the present invention. Light emitting diodes 21, 22 and 23 are placed in the array such that they conduct in the same electrical direction. Light emitting diodes 24, 25 and 26 are placed in the array such that they also conduct in the same electrical direction. However, diodes 21, 22 and 23 conduct in an opposite electrical direction from diodes 24, 25 and 26.

A modifying resistor 27 is placed in the array, in series with the light emitting diode circuit made up of diodes 21, 22, 23, 24, 25 and 26.

The resistance value R3 of resistor 27 is chosen according to the following formula:

$$R3 = \frac{\frac{(3Ro)\,(Vac - 3Vo)}{Vac}}{1 - \frac{(Vac - 3Vo)}{Vac}}$$

FIG. 3A shows that diodes 24, 25 and 26 light when power supply 28 provides an AC input signal such that terminal 29 is positive and terminal 30 is negative.

FIG. 3B shows that diodes 21, 22 and 23 light when power supply 28 provides an AC input signal such that terminal 29 is negative and terminal 30 is positive.

Figure 4:
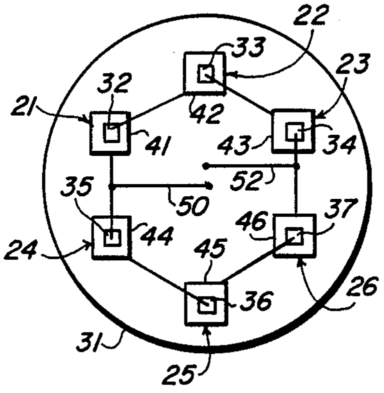
FIG. 4 is a front view of a cluster plate used in the light emitting diode lamp of the present invention.

FIG. 4 shows a cluster plate 31. The cluster plate supports a cluster of the light emitting diodes 21, 22, 23, 24, 25 and 26 of FIGS. 3A and 3B. These diodes have central anodes 32, 33, 34, 35, 36 and 37 respectively. These diodes also have outer cathodes 41, 42, 43, 44, 45 and 46, respectively. The anode of one diode is electrically connected to a cathode cf an adjacent diode. The light emitting diodes are thus electrically connected together as shown in FIGS. 3A and 3B. Lead 50 is connect between anode 35 and cathode 41. Lead 50 is connected to modifying resistor 27 shown in FIGS. 3A and 3B and FIG. 5. Lead 52 is connected between anode 34 and cathode 46. Lead 52 is connected to a base terminal 66 of a lamp 60 shown in FIG. 5. The leads on the top surface of the cluster plate are covered with a non-conductive opaque material, prior to assembly of the cluster plate into lamp 60. The diodes are covered with a nonconductive transparent material.

Figure 5:
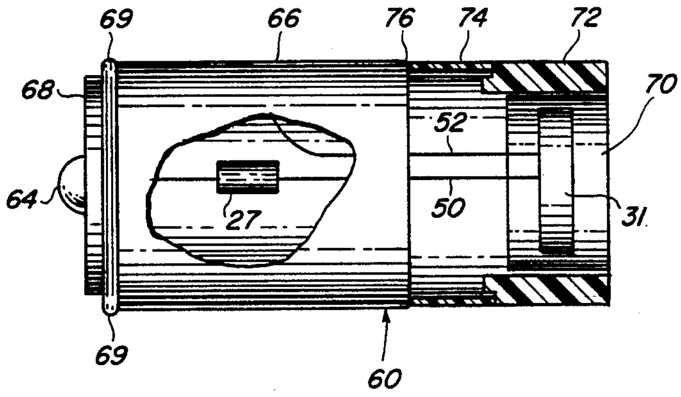
FIG. 5 is a side partially broken view of the light emitting diode lamp of the present invention.

Leads 50 and 52 pass to the back side of the cluster plate 31 in order to make proper electrical connections in the lamp 60 shown in FIG. 5. The light emitting diodes are held onto the cluster plate 31 by a suitable means, such as by means of clear plastic potting material.

FIG. 5 shows a light emitting diode lamp 60. FIG. 5 shows leads 50 and 52, also shown in FIG. 4. Lead 50 is connected to resistor 27, also shown in FIGS. 3A and 3B. Resistor 27 is in turn electrically connected to an end terminal 64. Lead 52 is electrical connected to a conductive base terminal 66. The end terminal 64 is held in a central position with respect to the longitudinal axis of base terminal 66 by means of an insulative end plate 68. A flange 69 is formed into base terminal 66.

The potted cluster plate 31 is potted in clear plastic material to form an element 70. The element 70 is held by plastic cylinder 72. The plastic cylinder 72 is held into notched plastic cylinder 74. Plastic cylinder 74 is held by the end 76 of the base electrode 66. Epoxy material holds leads 50 and 52 within plastic cylinder 74 and base terminal 66.

What is claimed is:

1. A light emitting diode lamp for indicating the presence of an AC input signal that has a higher voltage level than the operating voltage of selected light emitting diode means, comprising:

(a) A cylindrical cluster plate;

(b) A first light emitting diode means arranged in series in a first electrical direction and mounted in a first semicircular configuration on the cluster plate, for allowing AC current to pass therethrough when the AC input signal has a positive voltage relative to a reference voltage, said first means being free of a resistor, wherein the first light emitting diode means has a multiple number of light emitting diodes therein;

(c) A second light emitting diode means arranged in series in a second electrical direction and connected in a parallel circuit with the first series of light emitting diodes and mounted in a second semicircular configuration on the cluster plate, the first and second light emitting diode means forming a circular configuration on the cluster plate, for allowing an AC current to pass therethrough when the AC input signal has a negative voltage relative to a reference voltage, said second means being free of a resistor, wherein the second light emitting diode means has the same multiple number of light emitting diodes therein;

(d) First and second terminals connecting the first and second light emitting diode means, the first and second terminals being opposite of each other in the circular configuration, said light emitting diodes of said first and second light emitting diode means being at regular intervals in said circular configuration;

(e) A first lead connected to the first terminal, the first lead extending inward of the circular configuration and extending thence through the cluster plate and beyond;

(f) A second lead connected to the second terminal, the second lead extending inward of the circular configuration and extending thence through the cluster plate and beyond; and (g) A modifying resistor means connected to a free end of a said lead, the modifying resistor thus being in series circuit with both the first and second light emitting diode means for reducing the voltage level of the AC input signal to a useable value alternatively for the first and second light emitting diode means.

2. A light emitting diode lamp for indicating the presence of an AC input signal that has a higher voltage level than the operating voltage of selected light emitting diode means, comprising:

(a) A cylindrical cluster plate;

(b) A first light emitting diode means arranged in series in a first electrical direction and mounted in a first semicircular configuration on the cluster plate, for allowing AC current to pass therethrough when the AC input signal has a positive voltage relative to a reference voltage, said first means being free of a resistor, wherein the first light emitting diode means has a multiple number of light emitting diodes therein;

(c) A second light emitting diode means arranged in series in a second electrical direction and connected in a parallel circuit with the first series of light emitting diodes and mounted in a second semicircular configuration on the cluster plate, the first and second light emitting diode means forming a circular configuration on the cluster plate, for allowing an AC current to pass therethrough when the AC input signal has a negative voltage relative to a reference voltage, said second means being free of a resistor, wherein the second light emitting diode means has the same multiple number of light emitting diodes therein;

(d) A modifying resistor means connected in series circuit with both the first and second light emitting diode means for reducing the voltage level of the AC input signal to a useable value alternatively for the first and second light emitting diode means;

(e) A clear material means for holding the cluster plate;

(f) A first plastic cylinder means for holding the clear material means;

(g) A second notched plastic cylinder means for holding the first plastic cylinder means; and (h) A lamp means for providing mechanical support for both the second notched plastic cylinder means and the resistor means.

3. The light emitting diode lamp of claim 1 wherein the first and second diode means are covered by the clear material means.

* * * * *